(12) United States Patent
DeSantis et al.

(10) Patent No.: US 7,806,700 B2
(45) Date of Patent: Oct. 5, 2010

(54) AREA ARRAY ADAPTER

(75) Inventors: Charles V. DeSantis, Somers, CT (US); David E. Burchell, Vernon, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 19 days.

(21) Appl. No.: 12/344,849

(22) Filed: Dec. 29, 2008

(65) Prior Publication Data
US 2010/0167560 A1 Jul. 1, 2010

(51) Int. Cl.
*H01R 12/00* (2006.01)
(52) U.S. Cl. .................................... 439/66
(58) Field of Classification Search .............. 439/66, 439/81, 65, 91, 885, 246
See application file for complete search history.

(56) References Cited
U.S. PATENT DOCUMENTS

| | | | |
|---|---|---|---|
| 4,383,726 A | 5/1983 | Divers et al. | |
| 4,523,798 A | 6/1985 | Barrows et al. | |
| 6,036,508 A | 3/2000 | Anderson et al. | |
| 6,375,474 B1 * | 4/2002 | Harper et al. | 439/66 |
| 6,439,897 B1 | 8/2002 | Ikeya | |
| 6,524,115 B1 | 2/2003 | Gates et al. | |
| 6,533,589 B1 | 3/2003 | Palaniappa et al. | |
| 6,884,707 B1 | 4/2005 | Cherian | |
| 7,044,795 B2 | 5/2006 | Diep | |
| 7,077,659 B2 | 7/2006 | Weiss et al. | |
| 7,121,839 B2 | 10/2006 | Rathburn | |

\* cited by examiner

*Primary Examiner*—Jean F Duverne
(74) *Attorney, Agent, or Firm*—Carlson, Gaskey & Olds, P.C.

(57) ABSTRACT

An adaptor for connecting ball grid array components to a circuit board with a leaded grid array joint, utilizing electric leads which can connect to a ball grid array on one end and a leaded grid array pad pattern on the opposite end.

20 Claims, 1 Drawing Sheet

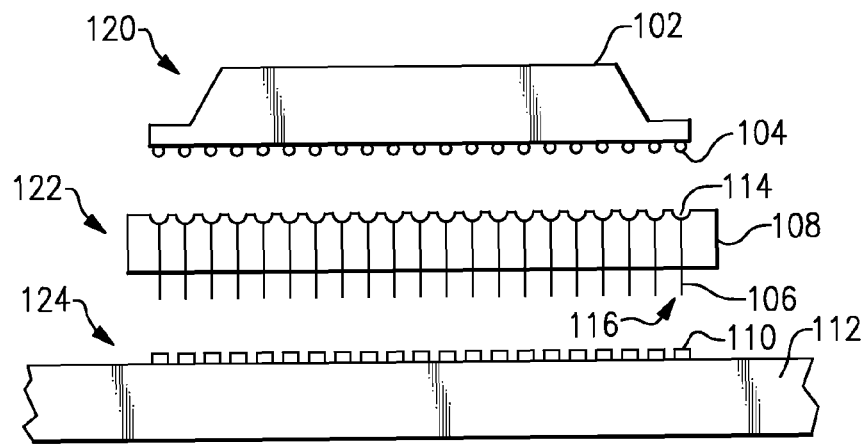
FIG. 1
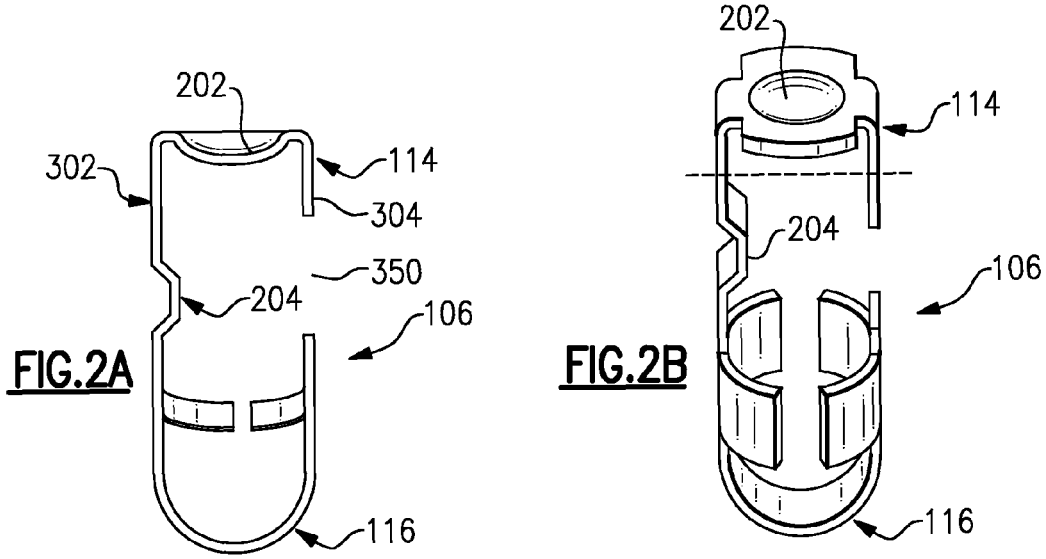
FIG. 2A
FIG. 2B
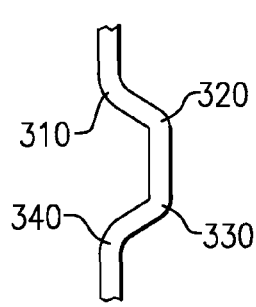
FIG. 3
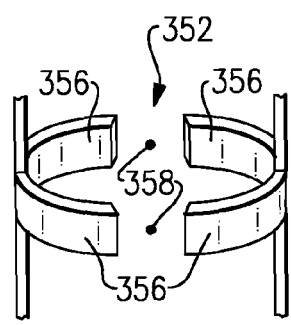
FIG. 4

AREA ARRAY ADAPTER

BACKGROUND OF THE INVENTION

The present application is related to circuit board assemblies, and specifically to an adaptor for connecting an electrical component with a ball grid array joint to a circuit board with a leaded grid array joint.

When creating circuit boards for performing specific functions a common method is to "print" electrical connections on the circuit board and then have joints where non-printable components (such as micro-chips, capacitors, etc.) can be connected to the printed board to complete the circuit. There are multiple standard joint types used to form these connections in the art.

One type of joint is a Ball Grid Array (BGA) joint where the component has balls of solder at each connection which are joined with the board using a total heating method, which solders the component to the board.

One disadvantage of using a BGA joint type arises because the solder and the electrical component have different thermal expansion/contraction rates than the circuit board to which they are attached. This difference results in stress placed on the BGA joints whenever there is thermal expansion or contraction. Due to the nature of a BGA joint the solder connection is particularly susceptible to additional stresses resulting from thermal expansion and contraction. The stress can cause a decrease in the lifespan of the joint and can lead to potential breakage.

SUMMARY OF THE INVENTION

Disclosed is an adaptor for connecting a component with a BGA connection type to a circuit board with a printed pad pattern using a Leaded Grid Array (LGA) connection type using electrical leads. The leads can connect to the BGA component on one end, and to a printed pad pattern of the circuit board on another end. This allows the BGA component to electrically connect to a LGA circuit board.

These and other features of the present invention can be best understood from the following specification and drawings, the following of which is a brief description.

BRIEF DESCRIPTION OF THE DRAWINGS

FIG. 1 is an exploded view of an example apparatus with a ball grid array component connected to a printed pad pattern on a circuit board with an area array adapter.

FIG. 2A is a side view of an example adaptor lead.

FIG. 2B is an isometric view of an example adaptor lead.

FIG. 3 is a zoomed in view of a hinge portion of a lead according to an example of the present disclosure.

FIG. 4 is a zoomed in view of a support portion of a lead according to an example of the present disclosure.

DETAILED DESCRIPTION OF THE PREFERRED EMBODIMENT

Referring to FIG. 1, an example apparatus having a BGA component 120, an area array adaptor 122, and a circuit board 124 is illustrated with an exploded view. In this example the BGA component 120 comprises an array of solder balls 104 on a bottom surface of a component operating portion 102. Each of the solder balls 104 in the array is capable of forming an electrical connection between the component operating portion 102 and another object, such as an adaptor 122.

The adaptor 122 shown in FIG. 1 is a cutout drawing providing a view of leads 106 located inside the area array adaptor 122. Each of the leads 106 is electrically conductive and corresponds to a connection needed for a BGA component 120/circuit board 124 connection. Each of the leads 106 is held in a carrier material 108. The carrier material 108 is non-conductive, and, depending on the material's composition, can also provide a cushioning for thermal expansion and contraction of the circuit board 124, the adaptor 122, and the BGA component 120. Each of the leads 106 has an indented top portion 114 capable of being connected to a solder ball 104 on a BGA device (such as the BGA component 120). Each of the leads 106 also has a pin-shaped bottom portion 116 capable of being connected to a printed pad pattern on the circuit board 112. The adaptor connections could be reversed with minor modifications to the leads 106 and the carrier 108, thereby connecting a leadless component to a circuit board having a BGA connection.

The circuit board 124 portion of FIG. 1 is capable of connecting to an electronic component using a LGA joint. The circuit board 124 has a set of printed pads 110 where each printed pad 110 corresponds to a single pin from an electronic component (or a lead 106 from an area array adaptor 122). The printed pads 110 are located on a larger circuit board substrate 112 thereby allowing all necessary connections for a complete circuit to be formed. A single circuit board 124 can contain several different components in addition to the BGA component 120 thereby forming a complete circuit.

FIG. 2A illustrates a side view and FIG. 2B illustrates an isometric view of an example lead 106 design capable of being used in an adaptor 122 and cushioning the stresses on the solder joints between the BGA component 120 and the adaptor 122, as well as between the adaptor 122 and the circuit board 124. In the illustrated example design, the lead 106 contains an indent 202 on the top end 114. The indent 202 is sized to be slightly larger than the size of the solder balls 104 (pictured in FIG. 1) which the adaptor 122 is designed to connect to. Prior to soldering, the solder balls 104 rest in the indent 202. The indent 202 holds the solder balls 104 in place during the soldering process and ensures that there are no accidental cross connections.

An electrical connection is provided from the solder ball 104 to the pin connector portion of the lead 106 at the bottom end 116 through a hinge portion 204. The hinge portion 204 is capable of flexing in response to heat related stresses, such as thermal expansion and compression, thereby absorbing a majority of the stresses and increasing the life expectancy of the solder joints. The hinge portion 204 connects to the pin shaped bottom end 116, which can be soldered to the circuit board 124.

The adaptor lead 106 illustrated in FIGS. 2A and 2B contains an indented portion 202 at the top end where a solder ball can rest prior to the total heating process. The top portion additionally contains two prongs 302, 304 extending downward. The first prong 302 extends downward to a hinge portion 204 (illustrated in FIG. 3), while the second prong 304 extends downward and ends at a gap portion 350. The hinge portion 204 then connects to a support portion 352 which connects with the pin portion 116.

The hinge portion 204, illustrated in FIG. 3, comprises a solid unit with four flexing regions 310, 320, 330, 340. The top flexing region 310 and the bottom flexing region 340 allow the lead to flex toward the gap portion 350 on the opposite side, while the middle flexing regions 320 and 330 allow the lead 106 to flex away from the gap portion 350 on the opposite side. The presence of the gap portion 350 on the opposite side of the hinge portion 204 allows the lead 106 room to flex in response to thermal expansion and contraction.

Immediately below the hinge portion 204 and the gap portion 350 is a support 352. The support 352 forms four wing portions 356 and two gaps 358. Alternately, the lead 106 could be constructed with only one gap in the support 352 by connecting one end of each of the wing portions 356.

The support 352 holds the lead 106 in place once the lead 106 is in the carrier 108. When the lead 106 is initially inserted into the carrier 108, the lead 106 is pinched together at the support 352. Once the lead 106 has been positioned inside the carrier 108, the natural resilience of the lead material causes the lead 106 to spring back to its original shape with the gaps 358 present. When the support 352 has sprung back to its original shape, each of the wings 356 fits into appropriately sized slots in the carrier 108, thereby holding the lead 105 in place while still allowing the hinge portion 204 to flex in response to thermal stresses.

Use of the area array adaptor 122 creates a complete electric connection between the solder ball 104 connections of the BGA component 120 and the printed pads 110 of the LGA circuit board 124 through the leads 106.

In order to form a permanent connection between the BGA component 120 and the circuit board 124 a solder connection can be used. In order to create a solder connection, initially the BGA component 120 is placed in contact with the top end 114 of the leads 106 in the adaptor 122. The bottom ends 116 of the leads 106 are placed in solder paste, preforms, or other solder application means on the printed pads 110 on the circuit board 124. Once each of the three parts has been properly positioned the apparatus is exposed to a temperature hot enough to melt the solder balls 104 from the BGA. The solder balls 104 are then allowed to cool thereby forming a permanent solder connection to the indented top end 114 of the leads 106. This process is referred to as a total heating process. Similarly, solder connections can be formed between the pin shaped bottom end 116 of the leads 106 and the printed pads 110 in the circuit board 124 using a total heating process.

The heat applied in a total heating process should be enough to melt solder without melting or damaging the components. The specific temperature used for the heating varies depending on the type of solder used and the heat tolerances of the specific components. Techniques for determining the appropriate temperature for a given apparatus are known in the art.

In ordinary use a component built according to the above disclosure will undergo several heating and cooling cycles after the apparatus has been assembled and installed. Since the BGA component 120 and the circuit board 124 have different thermal expansion and compression rates they will expand and compress different amounts in reaction to any temperature changes. The different expansion and compression rates place stress on the solder joints potentially weakening or eventually destroying them.

The thermal stresses are reduced through the hinge portion 204 of the lead 106, which adds flexibility to the connection without compromising electrical connectivity. The hinge portion 204 can flex in any direction in response to thermal stresses via the flexing regions 310, 320, 330, 340. The flexing of the lead 106 compensates for the different expansion rates thereby decreasing the stresses on the solder joints. Alternate lead designs using a different method for compensating for stresses or placing a hinge portion in a different location could be used and still fall within the scope of this disclosure.

Although an example embodiment has been disclosed, a worker of ordinary skill in this art would recognize that certain modifications would come within the scope of this invention. For that reason, the following claims should be studied to determine the true scope and content of this invention.

What is claimed is:

1. An apparatus for connecting a component to a circuit board wherein one of said component and said circuit board has a Ball Grid Array (BGA) connection and one of said component and said circuit board has a Leaded Grid Array (LGA) connection comprising;
   a non-electrically conductive carrier containing at least a set of electrically conductive leads;
   said leads being capable of forming an electrical connection to a BGA joint at a first end and being capable of forming an electrical connection to a LGA joint at a second end opposite of said first end; and
   said leads further comprising a hinge portion having a plurality of flexing regions.

2. The apparatus of claim 1, wherein an electrical component having a BGA connection or a circuit board having a BGA connection is to be connected to said first end of said lead.

3. The apparatus of claim 1, wherein a circuit board having a printed pad pattern for a leaded connection or an electrical component having a printed pad pattern for a leaded connection is to be connected to said second end of said lead.

4. The apparatus of claim 1, wherein a BGA component or a BGA circuit board is soldered to said apparatus using a total heat soldering method.

5. The apparatus of claim 1, wherein a leadless component or a LGA circuit board is soldered to said apparatus using a total heat soldering method.

6. The apparatus of claim 1, wherein said leads comprise a single electrically conductive piece capable of at least partially absorbing stresses resulting from thermal expansion and compression.

7. The apparatus of claim 6 wherein said leads comprise an indented portion, said hinge portion, a support portion, and a pin portion.

8. The apparatus of claim 7 wherein said support portion comprises at least two wing portions and at least one gap portion, wherein said gap portion allows the support portion to be pinched together, and wherein said wing portions are capable of resting in slots in a carrier thereby holding said lead in position.

9. The apparatus of claim 8 wherein said support portion comprises exactly four wing portions and exactly two gap portions.

10. The apparatus of claim 7 wherein said cup portion comprises at least two prongs extending perpendicular to an indent portion.

11. The apparatus of claim 10 wherein one of said prongs connects to said hinge portion, said hinge portion connects to said support portion, and said support portion connects to said pin portion.

12. The apparatus of claim 1, wherein said leads are contained within cavities in a housing consisting of a non-conductive material.

13. The apparatus of claim 12, wherein said -housing comprises at least a semi-rigid material.

14. The apparatus of claim 12, wherein said cavities are configured to allow said lead to at least partially flex without dislodging from said cavities.

15. An apparatus for connecting a component to a circuit board wherein one of said component and said circuit board has a Ball Grid Array (BGA) connection and one of said component and said circuit board has a Leaded Grid Array (LGA) connection comprising;

a non-electrically conductive carrier containing at least a set of electrically conductive leads;

said leads comprising a single electrically conductive piece having an indented portion, a hinge portion, a support portion, and a pin portion, being capable of forming an electrical connection to a BGA joint at a first end, being capable of at least partially absorbing stresses resulting from thermal expansion and compression, and being capable of forming an electrical connection to a LGA joint at a second end opposite of said first end; and said hinge portion comprises a top section angled inward connected to a middle section extending downward, said middle section being connected to a bottom section angled outward, and four flexing regions.

16. A circuit board assembly comprising;

at least one electrical component connected to a circuit board;

one of said electrical component and said circuit board having a Ball Grid Array (BGA) connection type, and one of said electrical component and said circuit board having a Leaded Grid Array (LGA) connection type; and an adaptor electrically connecting said component and said circuit board, said adapter further comprising a set of leads, wherein each of said leads comprises a hinge portion having multiple flexing regions.

17. The apparatus of claim 16, wherein each of said leads in said set of leads is capable of connecting to a BGA joint on a first end, and capable of connecting to a printed pad pattern on a second end.

18. The apparatus of claim 17, wherein each of said leads are capable of reducing joint stresses resulting from thermal expansion and contraction.

19. The apparatus of claim 17 wherein said each of said leads comprises:

said hinge portion having at least one flexing region capable of flexing in response to thermal expansion and compression, and each of said leads electrically connects said component and said circuit board.

20. The apparatus of claim 19, wherein each of said leads comprises a single conductive piece having an indent portion, said hinge portion, a gap portion, a support portion and a pin portion.

* * * * *